United States Patent
Camilleri et al.

(10) Patent No.: US 9,859,862 B2
(45) Date of Patent: Jan. 2, 2018

(54) GAIN PEAKING TECHNIQUES IN HIGH-FREQUENCY PASSIVE LOW PASS FILTERS

(71) Applicant: Nitero Pty Ltd., Fitzroy, Victoria (AU)

(72) Inventors: Natalino Camilleri, Cupertino, CA (US); Fan Zhang, Victoria (AU)

(73) Assignees: ADVANCED MICRO DEVICES, INC., Sunnyvale, CA (US); AMD FAR EAST LTD., Sunnyvale, CA (US)

(*) Notice: Subject to any disclaimer, the term of this patent is extended or adjusted under 35 U.S.C. 154(b) by 259 days.

(21) Appl. No.: 14/471,213

(22) Filed: Aug. 28, 2014

(65) Prior Publication Data

US 2016/0065163 A1    Mar. 3, 2016

(51) Int. Cl.

| | |
|---|---|
| *H03H 7/01* | (2006.01) |
| *H03H 7/38* | (2006.01) |
| *H03H 11/12* | (2006.01) |
| *H03H 7/40* | (2006.01) |
| *H04B 1/04* | (2006.01) |
| *H04B 1/18* | (2006.01) |

(52) U.S. Cl.
CPC ............ *H03H 7/0153* (2013.01); *H03H 7/40* (2013.01); *H03H 11/1204* (2013.01); *H04B 1/0458* (2013.01); *H04B 1/18* (2013.01); *H03H 7/383* (2013.01); *H03H 2210/021* (2013.01)

(58) Field of Classification Search
CPC .......... H03H 7/38; H03H 7/0115; H03H 7/40; H03H 7/383; H03H 2210/021; H03H 11/1204; H03H 11/12; H03H 7/0153
USPC ................... 333/4, 5, 32, 168, 175
See application file for complete search history.

(56) References Cited

U.S. PATENT DOCUMENTS

| | | | | |
|---|---|---|---|---|
| 3,886,469 | A * | 5/1975 | Rollett | H03H 11/12 327/552 |
| 3,974,461 | A * | 8/1976 | Luce | G10H 1/14 333/17.1 |
| 5,099,204 | A * | 3/1992 | Wheatley, III | H03G 3/3036 330/279 |
| 5,889,436 | A * | 3/1999 | Yeung | H03L 7/081 331/14 |
| 2008/0117000 | A1 * | 5/2008 | Wada | H03H 9/009 333/190 |
| 2009/0189715 | A1 * | 7/2009 | Sakisaka | H03H 7/0115 333/185 |

* cited by examiner

*Primary Examiner* — Rakesh Patel
(74) *Attorney, Agent, or Firm* — Hickman Palermo Becker Bingham LLP; Edward A. Becker

(57) ABSTRACT

Techniques to maintain gain flatness in the frequency response of a passband signal over a circuit chain. The techniques may be employed in the receive chain of a millimeter wave band wireless receiver, in the transmit chain of a millimeter wave band wireless transmitter, or in both the receive chain and the transmit chain of a millimeter wave band wireless transceiver. The techniques include mismatching the input and output impedance of a passive low pass filter used in the chain to peak the gain of the passband signal at or near the cutoff frequency (Fc) of the filter.

7 Claims, 8 Drawing Sheets

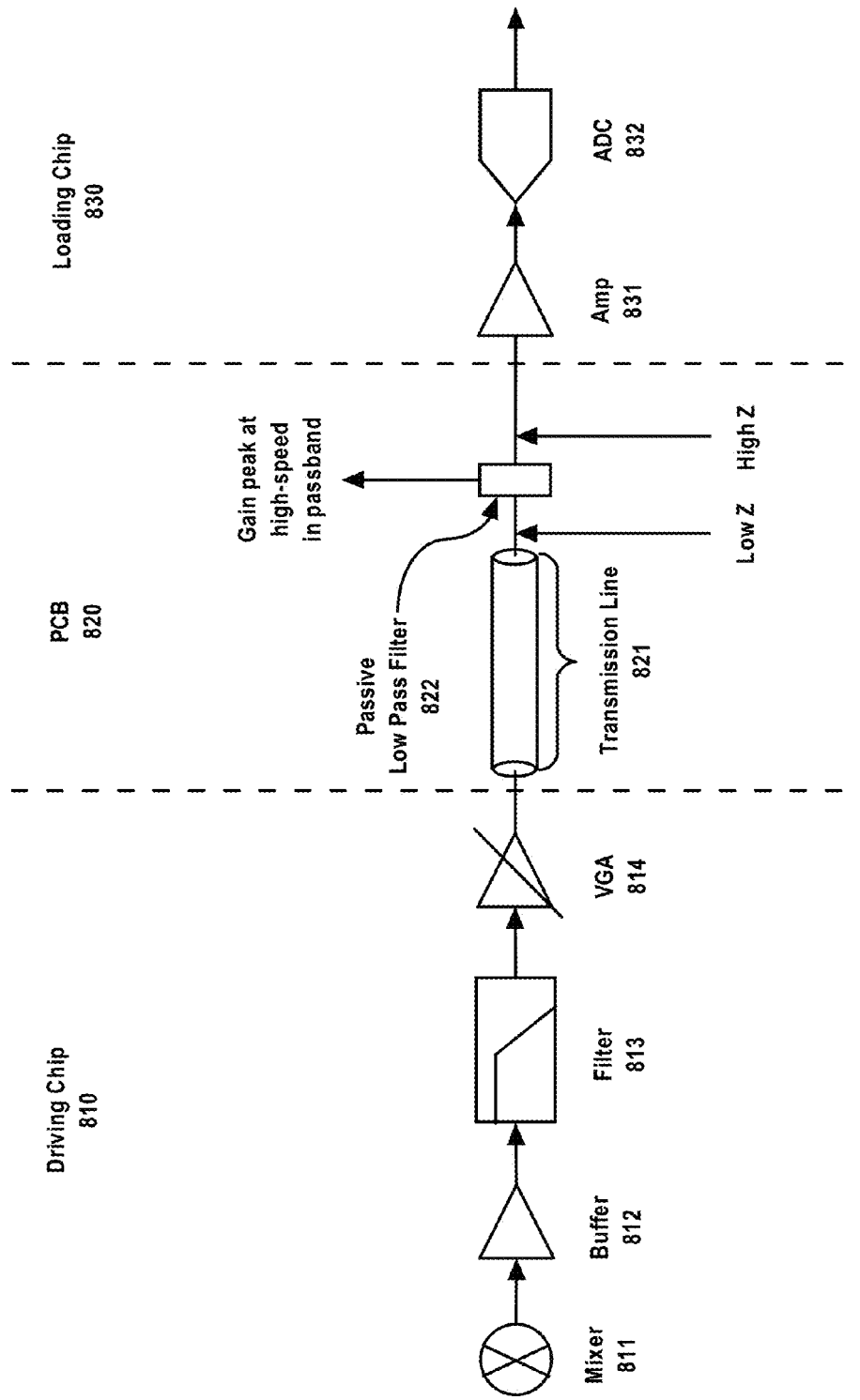

GAIN PEAKING TECHNIQUES IN HIGH-FREQUENCY PASSIVE LOW PASS FILTERS

FIELD OF THE INVENTION

The disclosed technologies relate generally to wireless radio communications, and more particularly, to techniques for gain peaking in the frequency response of high-frequency passive low pass filters.

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

For high-frequency radio communications systems such as those that receive and transmit data over millimeter wave frequency bands in the range of 30 GHz to 300 GHz, the frequency response of passive low pass filters used in transmit and receive chains of wireless communications devices often have a slope in the passband signal. The drop in the passband signal at the cutoff frequency (Fc) can be pronounced.

Often, the drop in the passband signal is caused by the low-Q and the self-resonant frequency (SRF) of the on-chip spiral inductors of the passive low pass filter. For example, for 60 GHz wireless applications where the cutoff frequency (Fc) can be around 1 GHz, the drop in the frequency response of the passband signal caused by the filter can be between 3 and 5 dB at the cutoff frequency (Fc).

In addition to the passband signal slope caused by the filter, the mixer and baseband amplifiers in the chain can also have a slope in the passband signal. Overall, the frequency response of the entire chain may have too much slope in the passband signal for a baseband chip or a radio frequency integrated circuit (RFIC) chip to work with.

What is needed are techniques for reducing the slope in the passband signal in the receive chain and the transmit chain of wireless communications devices.

BRIEF DESCRIPTION OF THE DRAWINGS

For a better understanding of the aforementioned embodiments of the invention as well as additional embodiments thereof, reference should be made to the Description of Embodiments below, in conjunction with the following drawings in which like reference numerals refer to corresponding parts throughout the figures.

FIG. 8 is a block diagram of a printed circuit board embodiment in which an inductor stage in the form of a passive low pass filter has been introduced on the printed circuit board between a driving chip and a loading chip to peak or increase the gain of the passband signal at the cutoff frequency of the filter, according to an embodiment of the present invention.

DETAILED DESCRIPTION

In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

1.0 Overview

Techniques are disclosed to maintain gain flatness in the frequency response of a passband signal over a circuit chain. The techniques may be employed in the receive chain of a millimeter wave band wireless receiver, in the transmit chain of a millimeter wave band wireless transmitter, or in both the receive chain and the transmit chain of a millimeter wave band wireless transceiver. The techniques include mismatching the input and output impedance of a passive low pass filter used in the chain to peak the gain of the passband signal at the cutoff frequency (Fc) of the filter. In some embodiments, the millimeter wave band is the 60 GHz band and the cutoff frequency (Fc) is at or near 1 GHz.

More specifically, the techniques include driving the passive low pass filter with a low input impedance to a higher output impedance to peak or increase the gain of the passband signal at the cutoff frequency (Fc) of the filter. The passive low pass filter can be placed on-chip or between chips on a printed circuit board. In one embodiment, the input (source) impedance is in the range of 10 to 1,000 Ohms and the output (load) impedance is the range of 100 to 10,000 Ohms and the source impedance is lower than the output impedance so as to peak or increase the gain of the passband signal at the cutoff frequency (Fc) of the filter.

2.0 On-Chip Implementation

Figure 1:
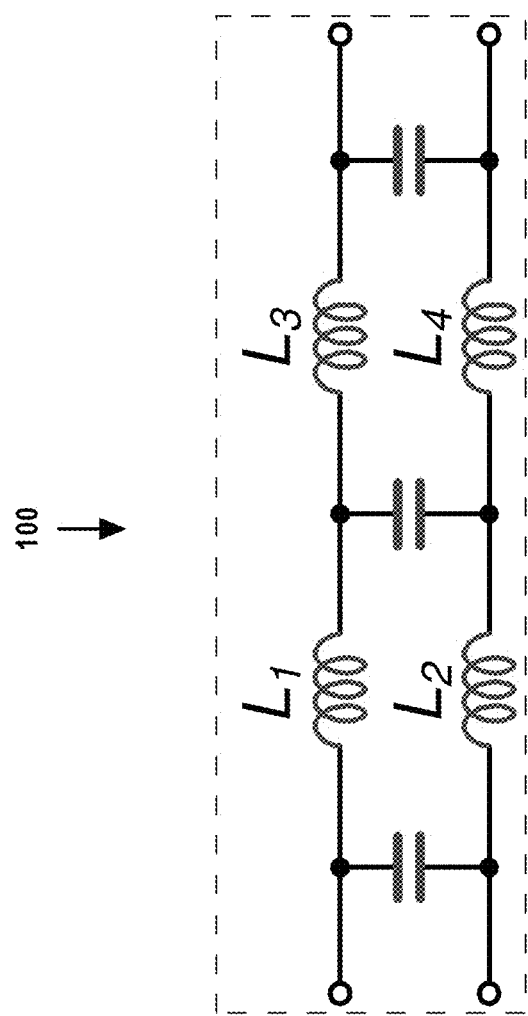
FIG. 1 is a circuit diagram of an example passive low pass filter.

Turning now to FIG. 1, it illustrates a typical 5-pole Chebyshev passive low pass filter 100 that may be used within a transmit chain or a receive chain of a millimeter wave band wireless communications device. Filter 100 can be used on-chip such as within a radio frequency integrated circuit (RFIC) or a baseband chip of the device. Filter 100 comprises four spiral inductors $L_1$, $L_2$, $L_3$, and $L_4$. As discussed above, the quality (Q) factor and self-resonant frequency (SRF) of the spiral inductors $L_1$, $L_2$, $L_3$, and $L_4$ can negatively affect the flatness of the frequency response of the passband signal of the filter 100. For example, for 60 GHz band wireless applications where the cutoff frequency (Fc) is at or around 1 GHz and the self-resonant frequency (SRF) of the spiral inductors $L_1$, $L_2$, $L_3$, and $L_4$ is low, the drop in the frequency response of the passband signal due to the filter 100 itself can be as much as 3 to 5 dB at the cutoff frequency (Fc) of the filter 100. Additional slope in the frequency response of the passband signal can be caused by other circuits in the transmit chain or the receive chain such as mixers and baseband amplifiers.

According to an embodiment of the present invention, to maintain flatness in the frequency response of the passband signal over the transmit chain or the receive chain, the input impedance and the output impedance of the filter 100 is mismatched from low to high to peak the gain of the passband signal at or near the cutoff frequency (Fc) of the filter 100.

Figure 2:
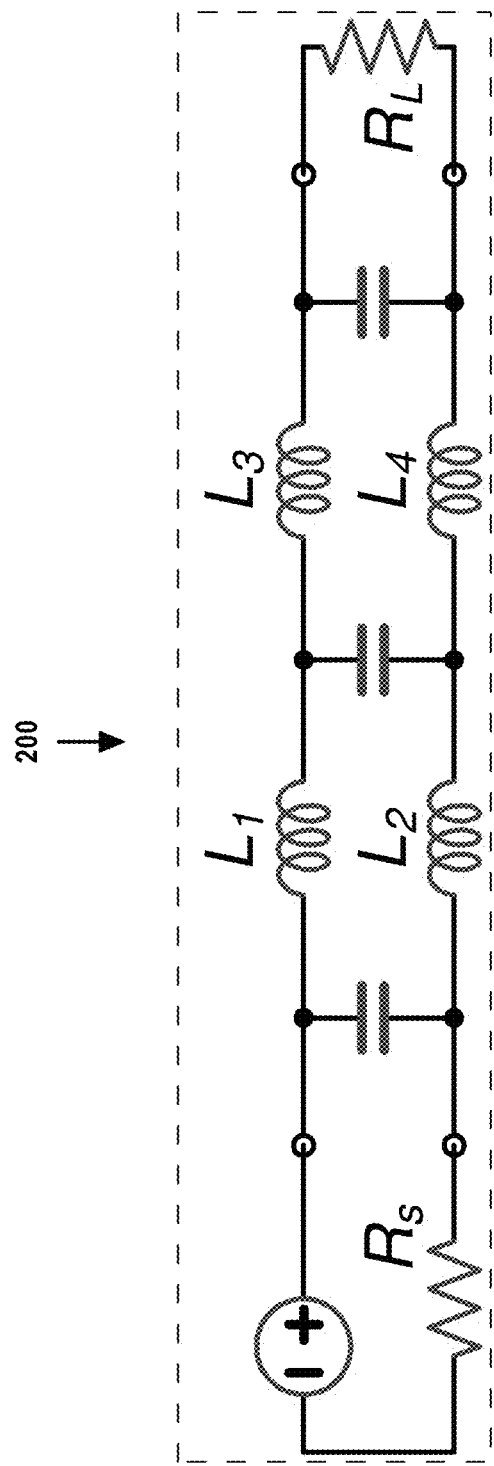
FIG. 2 is a circuit diagram of an example passive low pass filter with the input and the output impedance of the filter mismatched to peak or increase the gain of the passband signal at the cutoff frequency of the filter, according to an embodiment of the present invention.

For example, FIG. 2 illustrates a 5-pole Chebyshev passive low pass filter 200 that may be used with in a transmit chain or a receive chain of a millimeter wave band wireless communications device for passband signal gain peaking, according to an embodiment of the present invention. In an alternative embodiment, a 7-pole Butterworth passive low pass filter can be used instead.

Filter 200 can be used on-chip such as within a radio frequency integrated circuit (RFIC) or a baseband chip of the device. Filter 200 comprises four spiral inductors $L_1$, $L_2$, $L_3$, and $L_4$. The input impedance $R_S$ and the output impedance $R_L$ of filter 200 are mismatched to peak the gain in the frequency response of the passband signal at or near a cutoff frequency (Fc) of the filter 200. In one embodiment, the cutoff frequency (Fc) is at or near 1 GHz as shown in FIG. 3.

Mismatching the filter 200 to peak the gain involves selecting a low input impedance such that it is feasible to implement the spiral inductors $L_1$, $L_2$, $L_3$, and $L_4$ on-chip. In some embodiments, the input impedance to the filter 200 is selected to be in the range of 10 to 1,000 Ohms such that the filter 200 can be implemented with approximately ten (10) nano-henry (nH) spiral inductors $L_1$, $L_2$, $L_3$, and $L_4$. Mismatching the input and output impedance of the filter 200 to peak the gain of the passband signal also includes selecting a higher output impedance for the filter 200 that results in gain peaking of the passband signal at or near the cutoff frequency of the filter 200. In some embodiments, the selected output (load) impedance is up to an order of magnitude higher that the input (source) impedance.

Figure 3:
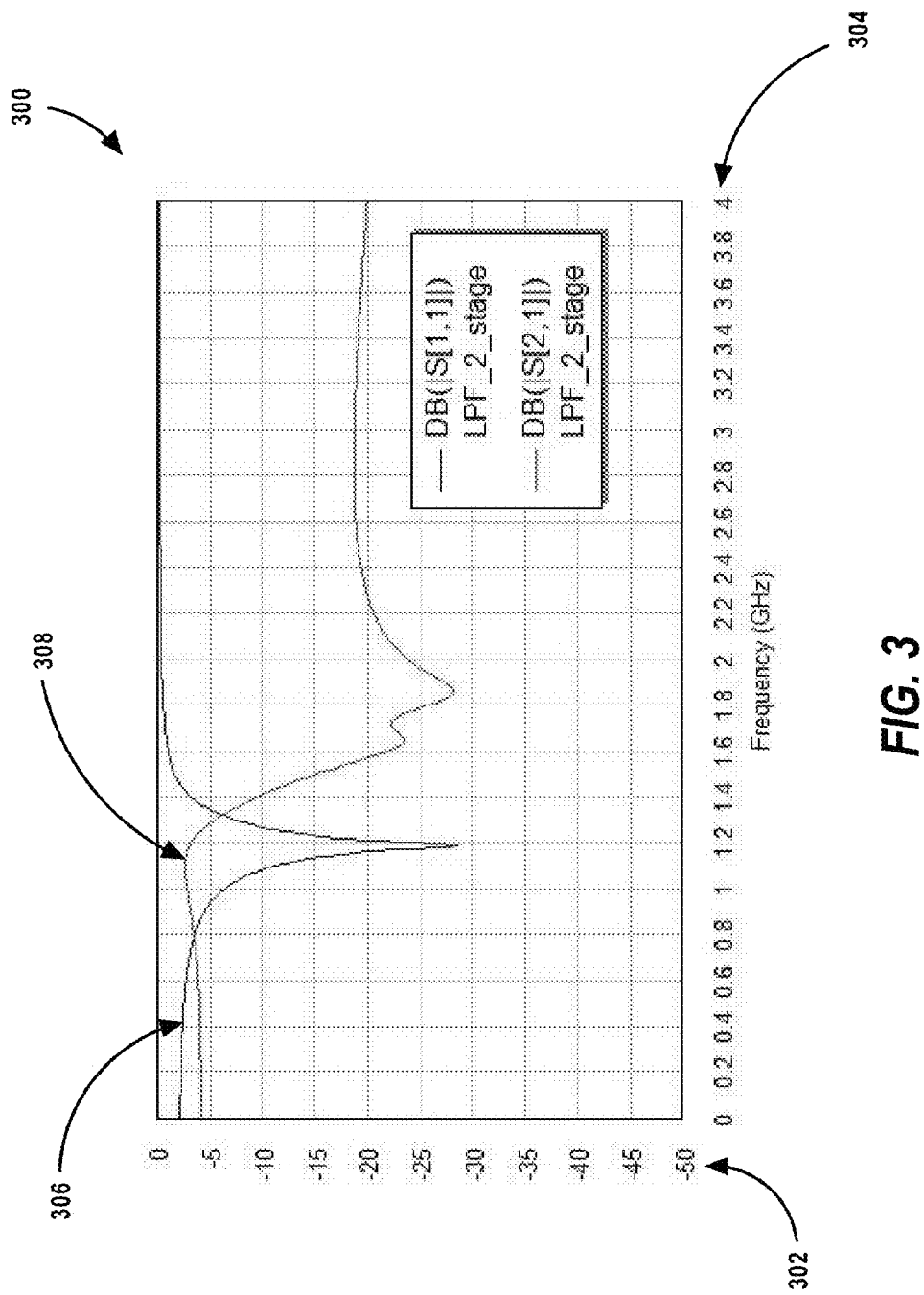
FIG. 3 is a chart of the frequency response of the passive low pass filter of FIG. 2.

FIG. 3 is a graph 300 of the frequency response and the reflection coefficient of the filter 200 when the input impedance $R_S$ is selected at 50 Ohms and the output impedance $R_L$ is selected at 500 Ohms. As can be seen from the plot 308 of gain vs frequency in graph 300, the gain of the passband signal peaks or is increasing at the cutoff frequency (Fc) of approximately 1 GHz. Plot 306 charts the return loss of the filter 200.

Figure 7:
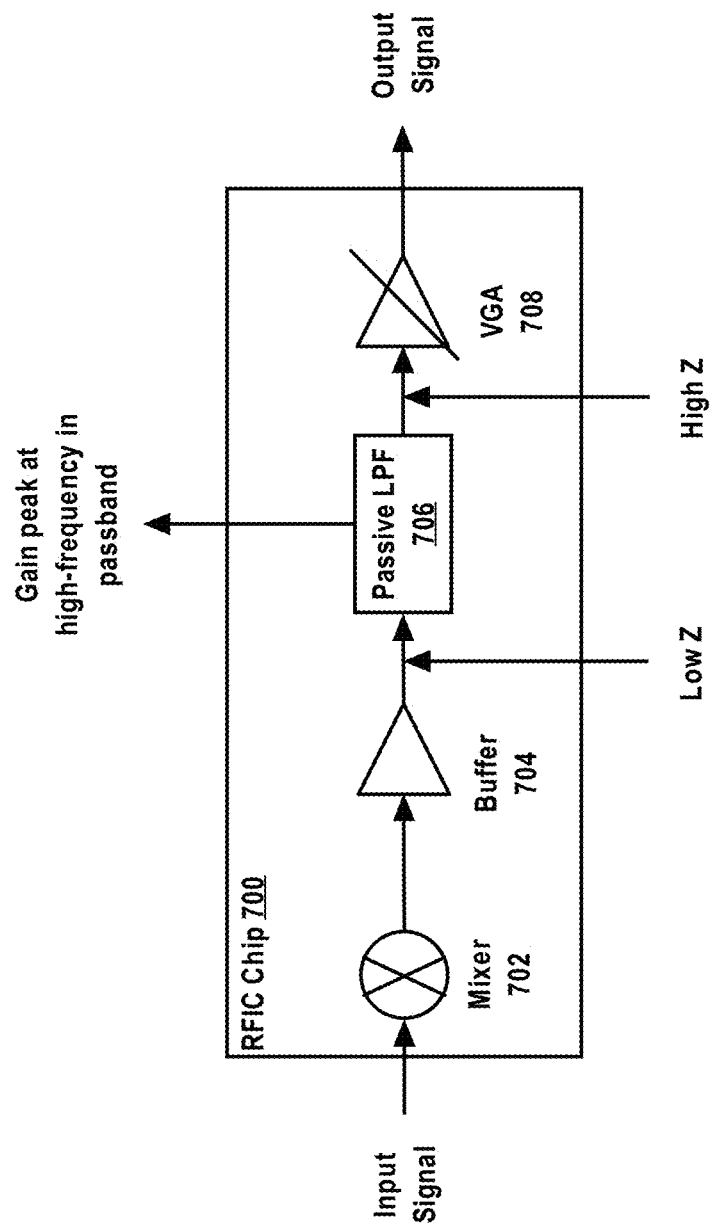
FIG. 7 is a block diagram of a radio frequency integrated circuit (RFIC) chip with a passive low pass filter having a mismatched input and output impedance to peak or increase the gain of the passband signal at the cutoff frequency of the filter, according to an embodiment of the present invention.

Turning now to FIG. 7, it is a block diagram of radio frequency integrated circuit (RFIC) chip 700 in which techniques for gain peaking may be implemented. The RFIC chip 700 may be included on a printed circuit board of a high-frequency wireless communications device such as, for example, a wireless communications device used for transmitting and/or receiving data wirelessly over a millimeter wave frequency band in the range of 30 to 300 GHz.

The RFIC chip 700 comprises a mixer circuit 702 that receives an input signal and sends an output signal to a buffer circuit 704 which in turn sends an output signal to a passive low pass filter circuit 706 which in turn sends a passband signal to a variable gain amplifier circuit 708 which in turn sends an output signal from the RFIC chip 700.

The buffer circuit 704 or other low output impedance circuit is configured to drive the passive low pass filter circuit 706 with a relatively low input impedance in the range of 10 to 1,000 Ohms. The passive low pass filter circuit 706 is configured to drive the variable gain amplifier circuit 608 or other high input impedance circuit with a higher input impedance in the range of 100 to 10,000 Ohms. It has been found that this mismatch in the input and output impedance of the passive low pass filter circuit 706 causes an increase or peak in the gain of the passband signal output by the passive low pass filter circuit 706 at high-frequency cutoffs. In some embodiments, the high-frequency cutoff is at or above 1 GHz.

3.0 Printed Circuit Board (PCB) Implementation

According to another embodiment of the present invention, gain peaking techniques are employed to peak the gain of a high-speed passband signal across a printed circuit board interconnection between a driving chip and a loading chip. For example, the techniques can be employed to peak the gain of a high-speed passband signal across a printed circuit board interconnection between a driving radio frequency integrated circuit (RFIC) chip and a loading baseband chip. In an embodiment, the high-speed passband signal is in the range of a few hundred MHz to a few GHz.

Figure 4:
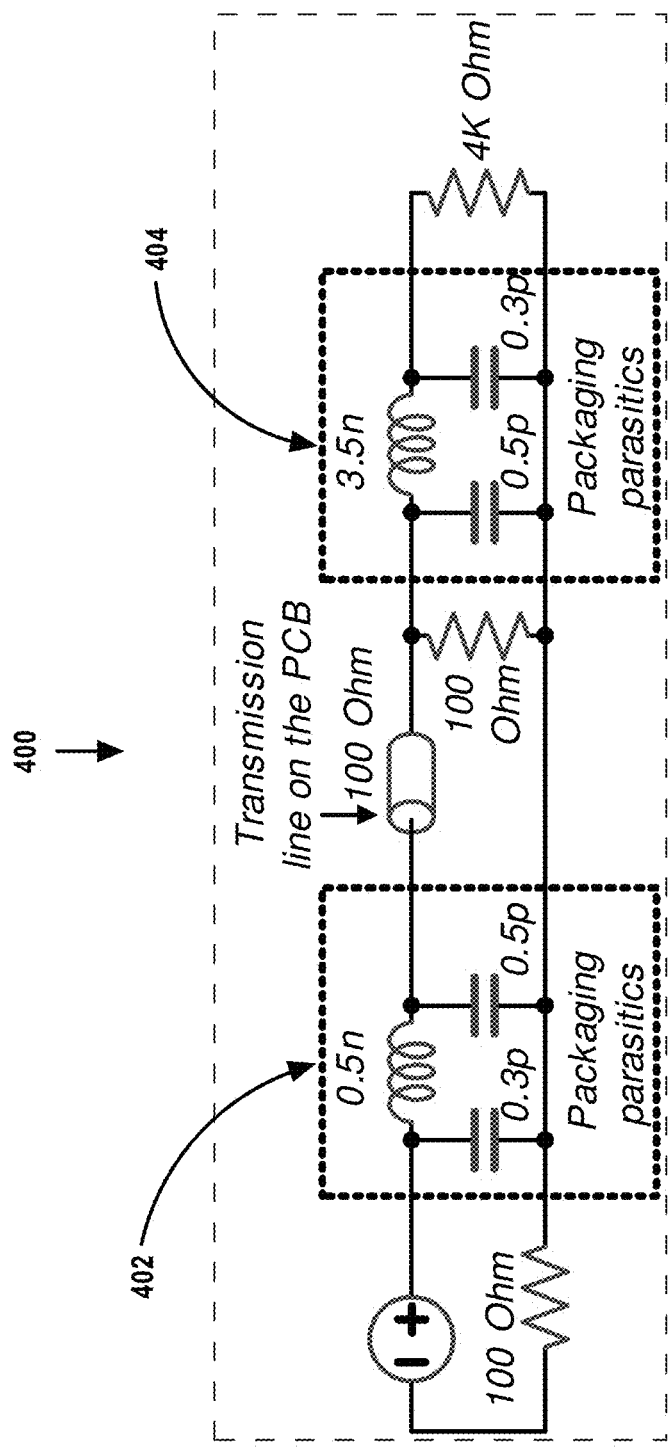
FIG. 4 is a circuit diagram example of a high-speed buffer driving a load through a transmission line on a printed circuit board.

Turning now to FIG. 4, it illustrates a typical circuit 400 in the receive or the transmit chain of a wireless communications device. The circuit 400 is being driven by a high-speed buffer (not shown) with a 100 Ohm output impedance. In particular, the buffer is driving a 4000 Ohm load through a 5 centimeter (cm) long 100 Ohm transmission line on a printed circuit board connecting a driving chip 402 and a loading chip 404. The driving chip 402 may be a radio frequency integrated circuit (RFIC) chip, for example. The loading chip 404 may be a baseband chip, for example. The frequency response of the signal through the printed circuit board interconnection is plotted as line 608 in graph 600.

According to an embodiment of the invention, the ripple due to the transmission line on the printed circuit board and the packaging parasitics of the driving chip and the loading chip are suppressed by introducing an inductor stage in the form of a passive low pass filter on the printed circuit board between the driving chip and the loading chip. Like in the on-chip scenario, the input and output impedance of the passive low pass filter is mismatched to peak the gain of the passband signal of the filter at or near the cutoff frequency (Fc) of the filter.

Figure 5:
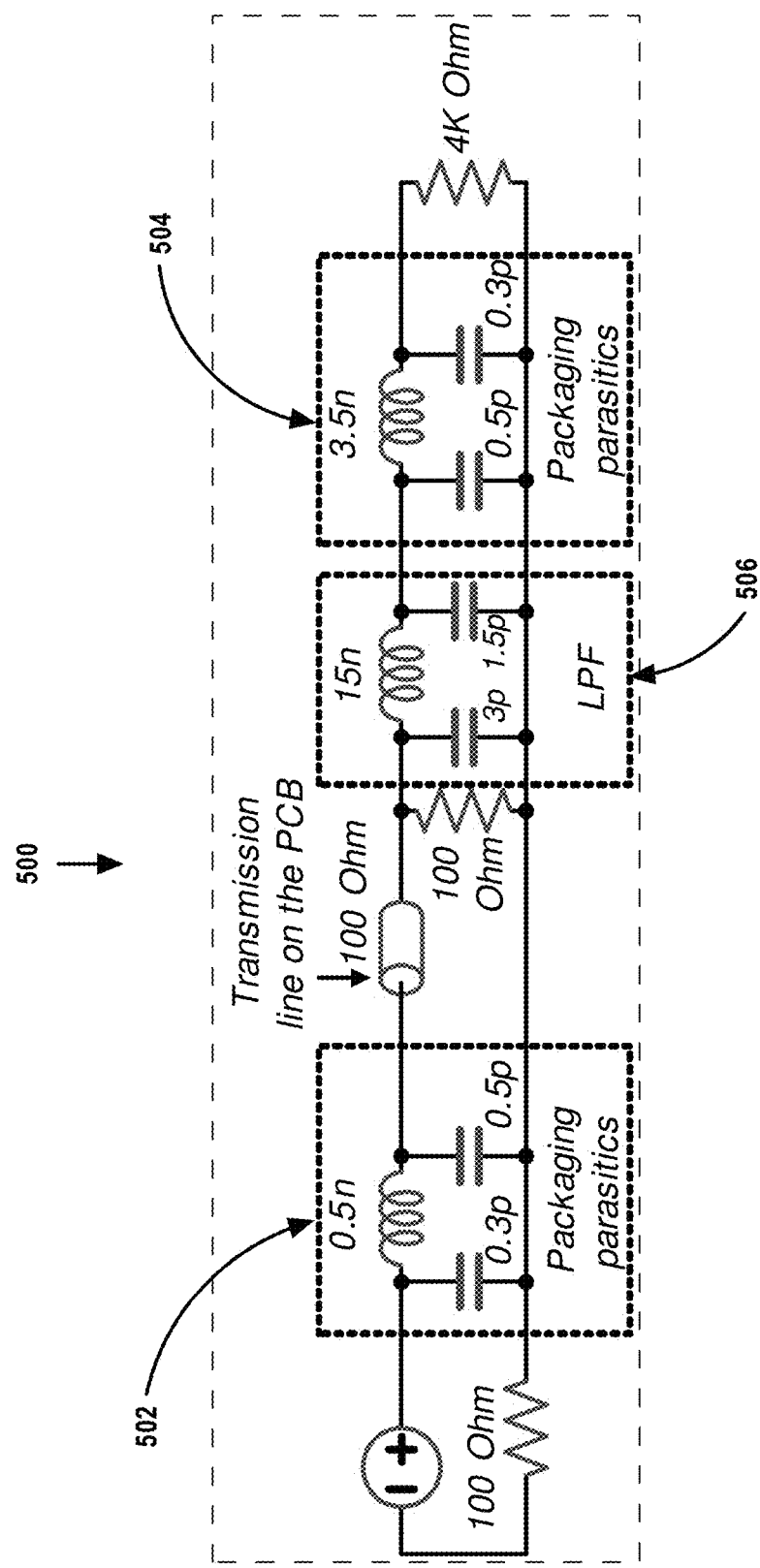
FIG. 5 is a diagram of the example circuit of FIG. 4 with the introduction of a passive low pass filter to peak or increase the gain of the passband signal at the cutoff frequency of the filter, according to an embodiment of the present invention.

For example, FIG. 5 illustrates a circuit 500 in the receive or the transmit chain of a wireless communications device, according to an embodiment of the present invention. Like circuit 400, the circuit 500 is being driven by a high-speed buffer (not shown) with a 100 Ohm output impedance driving a 4000 Ohm load through a 5 centimeter (cm) long 100 Ohm transmission line on a printed circuit board.

Figure 6:
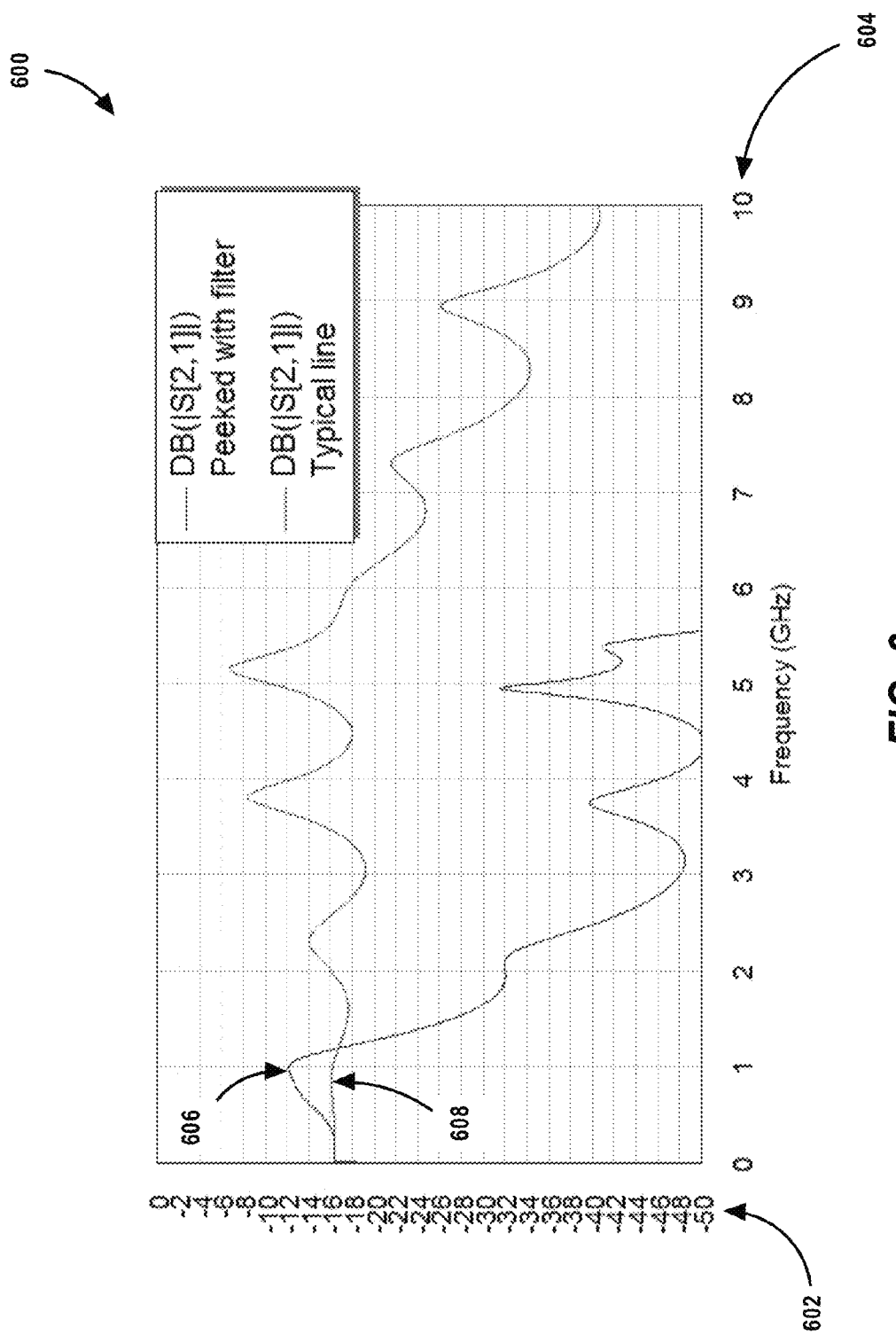
FIG. 6 is a chart of the frequency response of the high-speed printed circuit board interconnection of the example circuit of FIG. 4 and the frequency response of the interconnection with the introduction of an inductor stage in the form of a passive low pass filter between the driving chip and the loading chip as shown in the example circuit of FIG. 5.

An inductor stage in the form of a passive low pass filter 506 is added on the printed circuit board between the driving chip 502 and the loading chip 504. A mismatched input (source) and output (load) impedance for the filter 506 is used. More specifically, the source impedance of the filter 506 is selected to be lower by an order of magnitude or less than the load impedance of the filter 506. The result is a peak in the gain of the frequency response of the passband signal of the filter 506 that is fed to the loading chip 504 as shown in line 606 of chart 600 in FIG. 6. In some embodiments, the input source impedance of the filter 506 is in the range of 10 to 1,000 Ohms and the output load impedance of the filter 506 is in the range of 100 to 10,000 Ohms.

4.0 Combined On-Chip and Printed Circuit Board Implementation

Turning now to FIG. 8, it illustrates a printed circuit board (PCB) 820 embodiment in which an inductor stage in the form of a passive low pass filter 822 is inserted on the PCB 820 in between a driving chip 810 and a loading chip 830 to peak or increase the gain of the passband signal at the cutoff frequency.

In an embodiment, the driving chip 810 is radio frequency integrated circuit (RFIC) chip comprising a mixer 811 connected to a buffer 812 which is connected to a filter 813 which is connected to a variable gain amplifier 814. In an embodiment, the filter 813 is a passive low pass filter configured to peak or increase the gain of the passband signal sent to the VGA 814 as described above with respect to FIG. 7. Thus, in the circuit of FIG. 8, gain peaking techniques can be employed 1) on-chip 810 to peak or increase the gain at the cutoff frequency of the passband signal sent from filter 813 to VGA 814 and 2) on the printed circuit board 820 to peak or increase the gain at the cutoff frequency of the passband signal sent from passive low pass filter 822 to the loading chip 830. In an embodiment, the loading chip 830 is a baseband chip comprising an amplifier 831 and an analog-to-digital converter 832. However, filter 813 could be an active low pass filter according to the requirements of the particular implementation at hand.

In an embodiment, a load of 4000 Ohms is driven through the transmission line 821 having a length of 5 centimeters and a resistance of 100 Ohms. The input source impedance and the output load impedance of the low passive filter 822 are mismatched to peak or increase the gain of the passband signal of the filter 822 at the cutoff frequency. In an embodiment, the input source impedance is in the range of 10 to 1,000 Ohms and the output source impedance is in the range of 100 to 10,000 Ohms and the input source impedance is lower than the output source impedance. In an embodiment, the cutoff frequency is at or above 1 GHz.

5.0 Extensions and Alternatives

Embodiments of the invention are particularly suited for low-power 60 GHz or millimeter wave radio applications. For example, one suitable use for some embodiments of the present invention may be in battery-operated mobile wireless communications devices, such as enabling cell phones or laptop computers to wirelessly transmit large amounts of data, such as transmitting compressed or uncompressed video files to a video projector or monitor.

In the foregoing specification, embodiments of the invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

What is claimed is:

1. A radio frequency integrated circuit chip comprising:
   a low output impedance circuit;
   a high input impedance circuit;
   a passive low pass filter circuit configured to receive an input signal from the low output impedance circuit and configured to output a passband signal to the high input impedance circuit;
   wherein an input impedance and an output impedance of the passive low pass filter circuit are tuned to selectively peak or increase a gain of the passband signal at a cutoff frequency of the passive low pass filter circuit; and
   wherein the input impedance of the passive low pass filter circuit is lower than the output impedance of the passive low pass filter circuit.

2. The chip of claim 1, wherein the input impedance is an order of magnitude lower than the output impedance.

3. The chip of claim 1, wherein the input impedance is in the range of 10 to 1,000 Ohms and the output impedance is in the range of 100 to 10,000 Ohms.

4. The chip of claim 1, wherein the passive low pass filter circuit is a 5-pole Chebyshev passive low pass filter circuit, a 7-pole Chebyshev passive low pass filter circuit, a 5-pole Butterworth passive low pass filter circuit, or a 7-pole Butterworth passive low pass filter circuit.

5. The chip of claim 1, wherein the low output impedance circuit is a buffer circuit and the high input impedance circuit is a variable gain amplifier circuit.

6. The chip of claim 1, wherein the cutoff frequency is at or above 1 GHz.

7. The chip of claim 1, wherein the input impedance and the output impedance of the passive low pass filter circuit are tuned to peak gain of the passband signal at the cutoff frequency.

* * * * *